(12) United States Patent
Coenen et al.

(10) Patent No.: US 11,353,796 B2
(45) Date of Patent: Jun. 7, 2022

(54) METHOD AND APPARATUS FOR DETERMINING A RADIATION BEAM INTENSITY PROFILE

(71) Applicant: ASML Netherlands B.V., Veldhoven (NL)

(72) Inventors: Teis Johan Coenen, Vught (NL); Han-Kwang Nienhuys, Utrecht (NL); Sandy Claudia Scholz, Nettetal (DE); Sander Bas Roobol, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 200 days.

(21) Appl. No.: 16/556,603

(22) Filed: Aug. 30, 2019

(65) Prior Publication Data
US 2020/0098486 A1  Mar. 26, 2020

(30) Foreign Application Priority Data

Sep. 25, 2018 (EP) .................................. 18196626

(51) Int. Cl.
*G03F 7/20* (2006.01)
*G21K 1/06* (2006.01)
*G01T 1/29* (2006.01)

(52) U.S. Cl.
CPC ........ *G03F 7/70133* (2013.01); *G01T 1/2914* (2013.01); *G03F 7/2002* (2013.01);
(Continued)

(58) Field of Classification Search
CPC .. G03F 7/2002; G03F 7/2004; G03F 7/70058; G03F 7/70075; G03F 7/70083;
(Continued)

(56) References Cited

U.S. PATENT DOCUMENTS 6,160,622 A * 12/2000 Dirksen .............. G03F 7/70258
250/548
6,844,918 B2 * 1/2005 Navarro Y Koren ........................
G03F 9/7046
355/53

(Continued)

FOREIGN PATENT DOCUMENTS

EP       1628164 A2    2/2006
JP       04118529 A    4/1992
(Continued)

OTHER PUBLICATIONS

Huber, C. et al. "Corrections to the knife-edge based reconstruction scheme of tightly focused light beams". Optical Society of America, published on Oct. 14, 2013; 8 pages.

*Primary Examiner* — Allen C. Ho
(74) *Attorney, Agent, or Firm* — Sterne, Kessler, Goldstein & Fox P.L.L.C.

(57) ABSTRACT

Methods and apparatus for determining an intensity profile of a radiation beam. The method comprises providing a diffraction structure, causing a relative movement of the diffraction structure relative to the radiation beam from a first position, wherein the radiation beam does not irradiate the diffraction structure to a second position, wherein the radiation beam irradiates the diffraction structure, measuring, with a radiation detector, diffracted radiation signals produced from a diffraction of the radiation beam by the diffraction structure as the diffraction structure transitions from the first position to the second position or vice versa, and determining an intensity profile of the radiation beam based on the measured diffracted radiation signals.

17 Claims, 7 Drawing Sheets

(52) U.S. Cl.
CPC ........ *G03F 7/7015* (2013.01); *G03F 7/70058* (2013.01); *G03F 7/70075* (2013.01); *G03F 7/70083* (2013.01); *G03F 7/70091* (2013.01); *G03F 7/70141* (2013.01); *G03F 7/70158* (2013.01); *G21K 1/06* (2013.01); G03F 7/2004 (2013.01); G03F 7/2039 (2013.01); G21K 2201/067 (2013.01)

(58) Field of Classification Search
CPC ............ G03F 7/70091; G03F 7/70133; G03F 7/70141; G03F 7/7015; G03F 7/70158; G03F 7/70516; G03F 7/70616; G03F 7/2039
USPC ......................................................... 250/372
See application file for complete search history.

(56) References Cited

U.S. PATENT DOCUMENTS

| | | | | |
|---|---|---|---|---|
| 6,937,334 B2* | 8/2005 | Monshouwer | ........ | G03F 9/7049 356/399 |
| 6,937,344 B2* | 8/2005 | Monshouwer | ........ | G03F 9/7049 356/508 |
| 6,952,253 B2* | 10/2005 | Lof | ........ | G03F 7/7085 355/30 |
| 6,995,831 B2* | 2/2006 | Levasier | ........ | G03F 9/7003 355/53 |
| 7,030,961 B2* | 4/2006 | Den Boef | ........ | G03F 9/7011 355/53 |
| 7,112,813 B2* | 9/2006 | Den Boef | ........ | G03F 9/7046 250/548 |
| 7,307,690 B1* | 12/2007 | De Winter | ........ | G03B 27/42 355/53 |
| 7,362,446 B2* | 4/2008 | Van Der Pasch | ... | G03F 7/70775 355/53 |
| 7,400,381 B2* | 7/2008 | Botma | ........ | G03F 7/70158 355/53 |
| 7,403,293 B2* | 7/2008 | Pellemans | ........ | G03F 7/70616 356/521 |
| 7,433,018 B2* | 10/2008 | Butler | ........ | G03F 7/70633 257/E21.53 |
| 7,459,247 B2* | 12/2008 | Bijnen | ........ | G03F 7/70291 356/399 |
| 7,460,231 B2* | 12/2008 | Musa | ........ | G03F 9/7015 356/401 |
| 7,481,579 B2* | 1/2009 | Yokhin | ........ | G03F 7/70633 378/205 |
| 7,636,165 B2* | 12/2009 | Klaver | ........ | G03F 7/70775 356/488 |
| 7,701,577 B2* | 4/2010 | Straaijer | ........ | G01B 11/0641 356/369 |
| 7,791,724 B2* | 9/2010 | Den Boef | ........ | G03F 7/70566 356/369 |
| 7,927,090 B2* | 4/2011 | Ten Berge | ........ | G03F 9/7042 425/150 |
| 8,115,926 B2* | 2/2012 | Straaijer | ........ | G03F 7/70566 356/364 |
| 8,339,595 B2* | 12/2012 | Den Boef | ........ | G03F 7/7015 356/237.5 |
| 8,411,287 B2* | 4/2013 | Smilde | ........ | G03F 7/70633 356/620 |
| 8,553,227 B2* | 10/2013 | Jordanoska | ........ | G03F 7/70625 356/369 |
| 8,681,312 B2* | 3/2014 | Straaijer | ........ | G03F 7/70616 355/53 |
| 8,692,994 B2* | 4/2014 | Straaijer | ........ | G03F 7/70625 356/369 |
| 8,786,825 B2* | 7/2014 | Van De Kerkhof | ........ | G01N 21/956 355/67 |
| 8,792,096 B2* | 7/2014 | Straaijer | ........ | G01N 21/211 356/369 |
| 8,797,554 B2* | 8/2014 | Straaijer | ........ | G03F 7/70616 356/625 |
| 8,823,922 B2* | 9/2014 | Den Boef | ........ | G03F 7/70633 355/71 |
| 8,830,472 B2* | 9/2014 | Den Boef | ........ | G01N 21/95607 356/446 |
| 8,891,061 B2* | 11/2014 | Leewis | ........ | G03F 7/70625 355/55 |
| 9,518,865 B2* | 12/2016 | Gnausch | ........ | G01J 1/429 |
| 9,958,791 B2* | 5/2018 | Mathijssen | ........ | G03F 7/213 |
| 10,013,518 B2* | 7/2018 | Bakeman | ........ | G03F 7/70625 |
| 10,025,199 B2* | 7/2018 | Den Boef | ........ | G03F 9/708 |
| 10,061,212 B2* | 8/2018 | Van Der Schaar | ........ | G03F 7/70516 |
| 10,067,074 B2* | 9/2018 | Quintanilha | ........ | G03F 7/70625 |
| 10,078,268 B2* | 9/2018 | Den Boef | ........ | G03F 7/70625 |
| 10,180,628 B2* | 1/2019 | Cramer | ........ | G03F 7/70133 |
| 10,330,606 B2* | 6/2019 | Van Voorst | ........ | G03F 7/7065 |
| 10,338,484 B2* | 7/2019 | Den Boef | ........ | G01B 11/272 |
| 10,461,490 B2* | 10/2019 | Ni | ........ | G03F 7/70616 |
| 10,488,765 B2* | 11/2019 | Van Boxmeer | .... | G01N 21/8806 |
| 10,527,949 B2* | 1/2020 | Den Boef | ........ | G01B 11/27 |
| 10,642,172 B2* | 5/2020 | O Dwyer | ........ | G02F 1/353 |
| 10,705,430 B2* | 7/2020 | Sanguinetti | ........ | G03F 7/70566 |
| 10,712,667 B2* | 7/2020 | Oemrawsingh | ........ | G03F 7/7085 |
| 10,782,617 B2* | 9/2020 | Tsiatmas | ........ | G03F 7/7065 |
| 10,788,758 B2* | 9/2020 | Lian | ........ | G03F 7/70633 |
| 10,795,269 B2* | 10/2020 | Zhou | ........ | G03F 7/70633 |
| 10,801,975 B2* | 10/2020 | Bakeman | ........ | G01N 23/201 |
| 10,802,409 B2* | 10/2020 | Fan | ........ | G03F 7/70683 |
| 10,816,909 B2* | 10/2020 | Tinnemans | ........ | G03F 7/70625 |
| 10,895,452 B2* | 1/2021 | Van Dam | ........ | G02F 1/33 |
| 10,908,513 B2* | 2/2021 | Noot | ........ | G03F 7/70516 |
| 10,955,744 B2* | 3/2021 | Van Witteveen | ... | G03F 7/70483 |
| 10,955,756 B2* | 3/2021 | Cramer | ........ | G03F 9/7084 |
| 10,996,573 B2* | 5/2021 | Ten Berge | ........ | G03F 7/70616 |
| 2007/0224518 A1 | 9/2007 | Yohkin et al. | | |
| 2010/0328655 A1 | 12/2010 | Den Boef | | |
| 2011/0026032 A1 | 2/2011 | Den Boef et al. | | |
| 2011/0043791 A1 | 2/2011 | Smilde et al. | | |
| 2011/0102753 A1 | 5/2011 | Van De Kerkhof et al. | | |
| 2011/0249244 A1 | 10/2011 | Leewis et al. | | |
| 2012/0044470 A1 | 2/2012 | Smilde et al. | | |
| 2013/0162996 A1 | 6/2013 | Straaijer et al. | | |
| 2013/0304424 A1 | 11/2013 | Bakeman et al. | | |
| 2014/0019097 A1 | 1/2014 | Bakeman et al. | | |
| 2015/0060683 A1 | 3/2015 | Gnausch et al. | | |
| 2016/0161863 A1 | 6/2016 | Den Boef et al. | | |
| 2016/0282282 A1 | 9/2016 | Quintanilha et al. | | |
| 2016/0370717 A1 | 12/2016 | Den Boef et al. | | |

FOREIGN PATENT DOCUMENTS

| | | |
|---|---|---|
| JP | 07280527 A | 10/1995 |
| WO | WO 2011/012624 A1 | 2/2011 |

* cited by examiner

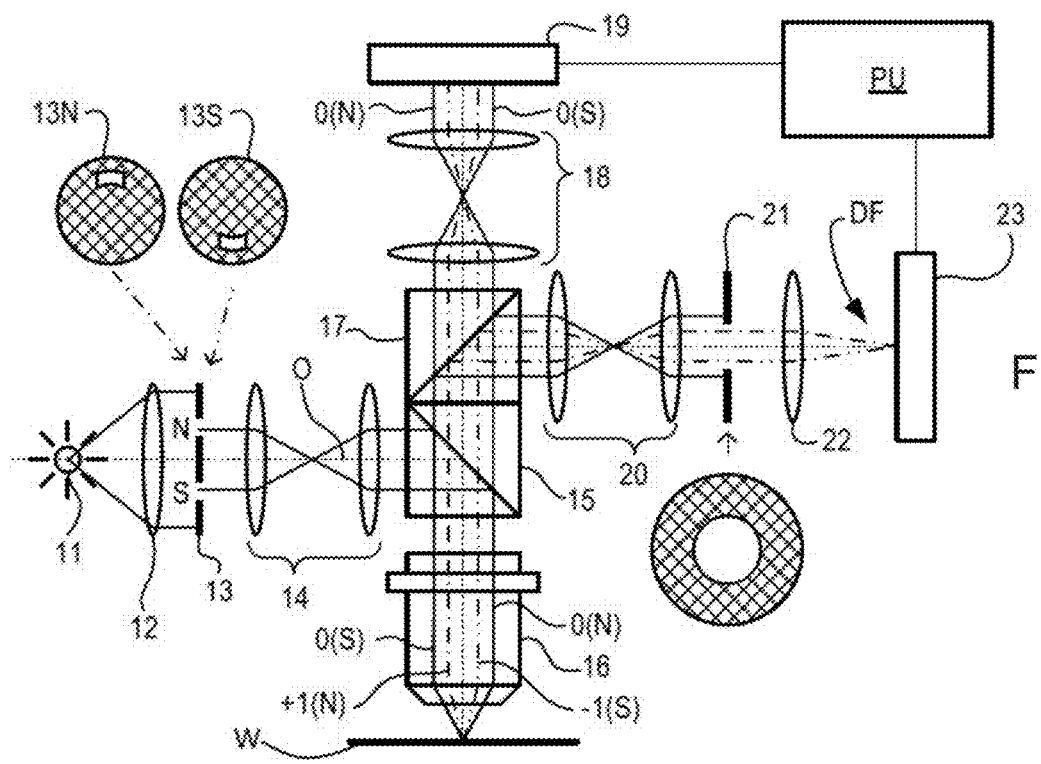
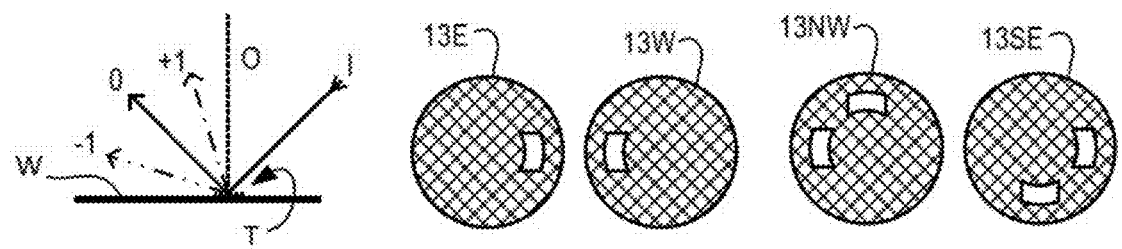
Fig. 4(a)
Fig. 4(b)     Fig. 4(c)     Fig. 4(d)

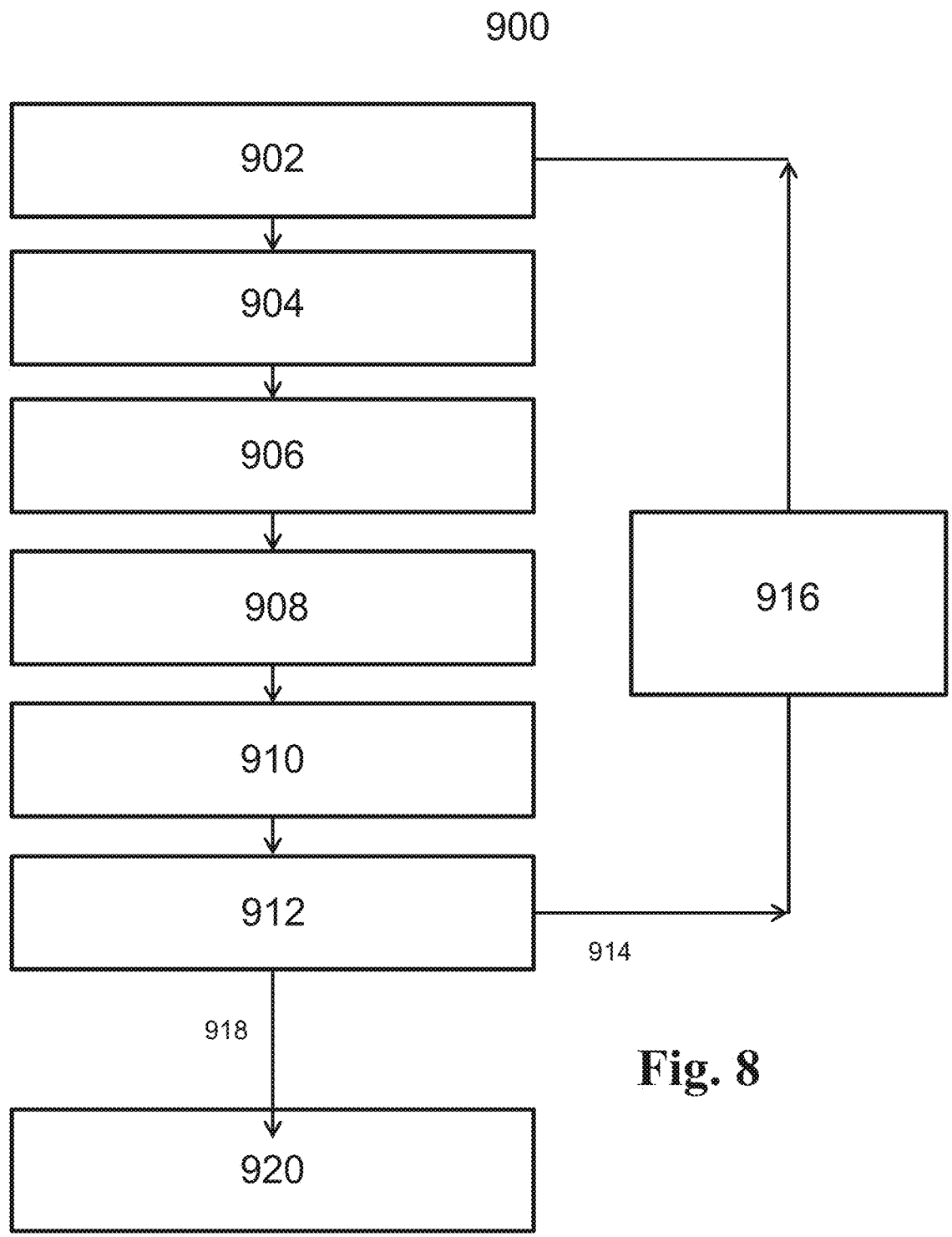

METHOD AND APPARATUS FOR DETERMINING A RADIATION BEAM INTENSITY PROFILE

FIELD

The present invention relates to methods and apparatus for determining properties of a radiation beam. Specifically, the invention may relate to a method and/or apparatus for determining an intensity profile of a radiation beam.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Characteristics of the lithographic apparatus and/or the patterns it exposes on a substrate may be analyzed using a metrology apparatus. The metrology apparatus may use a radiation beam to illuminate a pattern to be analyzed, and the resulting radiation signals may be measured and used to discover one or more of the characteristics of the illuminated pattern. Properties of the radiation beam used by the metrology apparatus may affect the resulting measured signals, and in order to correctly analyze the measured radiation signals, it may be required to determine one or more radiation beam properties. Properties of the radiation beam that may affect resulting measured signals may include for example, wavelength, power, size, and shape of the radiation beam. Another property that may influence characteristics of the measured radiation signals is the intensity profile of incident radiation beam on the pattern. It is therefore desirable and useful to know the intensity profile of radiation used for metrology of a pattern on a substrate. Such an intensity profile may be determined using a knife-edge method, wherein a sharp boundary, or knife-edge, is moved through the profile of the beam to be analyzed. The boundary partially blocks or unblocks the radiation and the effect on the radiation are analyzed by a photodetector to obtain an estimate of an intensity profile. Performing knife-edge intensity measurements requires insertion of knife-edge equipment into the radiation path of the patterning electromagnetic radiation. Furthermore, in order to obtain an intensity profile with a high resolution, strict manufacturing requirements are linked to the knife-edge tools.

SUMMARY

According to an aspect of the invention there is provided a method of determining an intensity profile of a radiation beam, wherein the method comprises providing a diffraction structure, causing relative movement of the diffraction structure relative to the radiation beam from a first position wherein the radiation beam does not irradiate the diffraction structure to a second position wherein the radiation beam irradiates the diffraction structure, measuring, with a radiation detector, diffracted radiation signals produced from diffraction of the radiation beam by the diffraction structure as the diffraction structure transitions from the first position to the second position or vice versa; and determining the intensity profile of the radiation beam based on the measured diffracted radiation signals.

Optionally, substantially the entire cross-section of the radiation beam irradiates the diffraction surface, in the second position.

Optionally, the intensity profile is determined for a dimension of a cross-section of the radiation beam in a plane lateral to the propagation direction of the radiation beam.

Optionally, the intensity profile of the radiation beam is determined in a target plane.

Optionally, the target plane is located in a focal plane of the radiation beam.

Optionally, the target plane is located in a substrate plane.

Optionally, causing relative movement of the diffraction structure relative to the radiation beam comprises moving the diffraction structure linearly in a first direction.

Optionally the method further comprises moving the diffraction structure linearly in a second direction from a third position wherein the radiation beam does not irradiate the diffraction structure to a fourth position wherein of the radiation beam irradiates the diffraction structure, or vice versa.

Optionally, the diffraction structure is a diffraction grating structure.

Optionally, the diffraction grating structure has a structure formed by a lithographic process.

Optionally the diffraction grating structure has a structure formed by an etching process.

Optionally, the diffraction grating structure has a pitch, wherein the pitch is selected to obtain at least one diffraction order when irradiated by the radiation beam.

Optionally, the diffracted radiation signals are first order diffracted signals.

Optionally, the radiation beam irradiates a reference structure, in the first position, wherein the reference structure comprises a reference diffraction grating with a different pitch to the diffraction grating, and wherein the move from the first position to the second position includes a transition of the radiation beam from the reference structure to the diffraction grating.

Optionally, determining the intensity profile comprises determining a cumulative diffraction function, based on the measured data, of the diffracted radiation as a function of location of the diffraction grating relative to the radiation beam, and differentiating the cumulative diffraction function to obtain the intensity profile.

Optionally, the radiation beam is a soft X-ray radiation beam or an Extreme Ultra Violet (EUV) radiation beam.

Optionally, the radiation beam comprises a plurality of wavelengths. The method may further comprise simultaneously measuring, with a radiation detector, a plurality of diffracted radiation signals for the plurality of wavelengths; and determining the intensity profile of the radiation beam for the plurality of wavelengths.

According to another aspect of the invention there is provided an apparatus for determining an intensity profile of a radiation beam, wherein the apparatus comprises a diffraction structure moveable relative to the radiation beam from a first position in which the diffraction structure is not irradiated by the radiation beam to a second position in which the diffraction structure is irradiated by the radiation beam, or vice versa, a radiation detector configured to detect diffracted radiation signals of the radiation beam diffracted by the diffraction structure, and a processor configured to execute instructions comprising receiving data representing the diffracted radiation signals from the radiation detector, and determining the intensity profile, based on the received data representing the diffracted radiation signals.

Optionally, the diffraction structure is located on a substrate support of the apparatus.

Optionally, the processor is further configured to execute instructions to control movement of the substrate support to cause movement of the structure linearly from the first position to the second position, or vice versa.

Optionally, the processor is further configured to execute instructions to control movement of the substrate support to cause movement of the structure linearly from a third position wherein the radiation beam does not irradiate the diffraction structure to a fourth position wherein the radiation beam irradiates the diffraction structure.

Optionally, the diffraction structure is a diffraction grating.

Optionally, the apparatus further comprises a reference structure moveable with the diffraction structure, wherein the radiation beam irradiates the reference structure at the first position.

Optionally, the reference structure comprises a reference diffraction grating with a different pitch to that of the diffraction structure.

Optionally, the apparatus further comprises a substrate supporting table, wherein the diffraction structure is provided on an area of the substrate supporting table outside an area for receiving a substrate.

According to another aspect of the invention there is provided a metrology apparatus comprising the apparatus.

According to another aspect of the invention there is provided a lithographic cell comprising the apparatus, or comprising the metrology apparatus.

According to another aspect of the invention there is provided a carrier containing a computer program wherein the carrier is a non-transitory computer readable storage medium, and wherein the computer program comprises instructions for being executed on at least one processor of an apparatus, which when executed cause the processor to carry out the method described above.

BRIEF DESCRIPTION OF THE DRAWINGS

Embodiments of the invention will now be described, by way of example only, with reference to the accompanying schematic drawings, in which:

FIGS. 4(a)-4(d) comprise 4(a) a schematic diagram of a dark field scatterometer for use in measuring targets according to embodiments of the invention using a first pair of illumination apertures, 4(b) a detail of diffraction spectrum of a target grating for a given direction of illumination 4(c) a second pair of illumination apertures providing further illumination modes in using the scatterometer for diffraction based overlay measurements and 4(d) a third pair of illumination apertures combining the first and second pair of apertures;

FIG. 8 depicts a flow diagram representing steps in a method of determining an intensity profile;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm), EUV radiation (extreme ultra-violet radiation, e.g. having a wavelength in the range of about 5-100 nm), soft X-ray radiation (e.g. having a wavelength in the range of about 10-20 nm), visible radiation (e.g. having a wavelength in the range of about 400 nm to 750 nm), or any radiation between 1 nm to 2000 nm.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
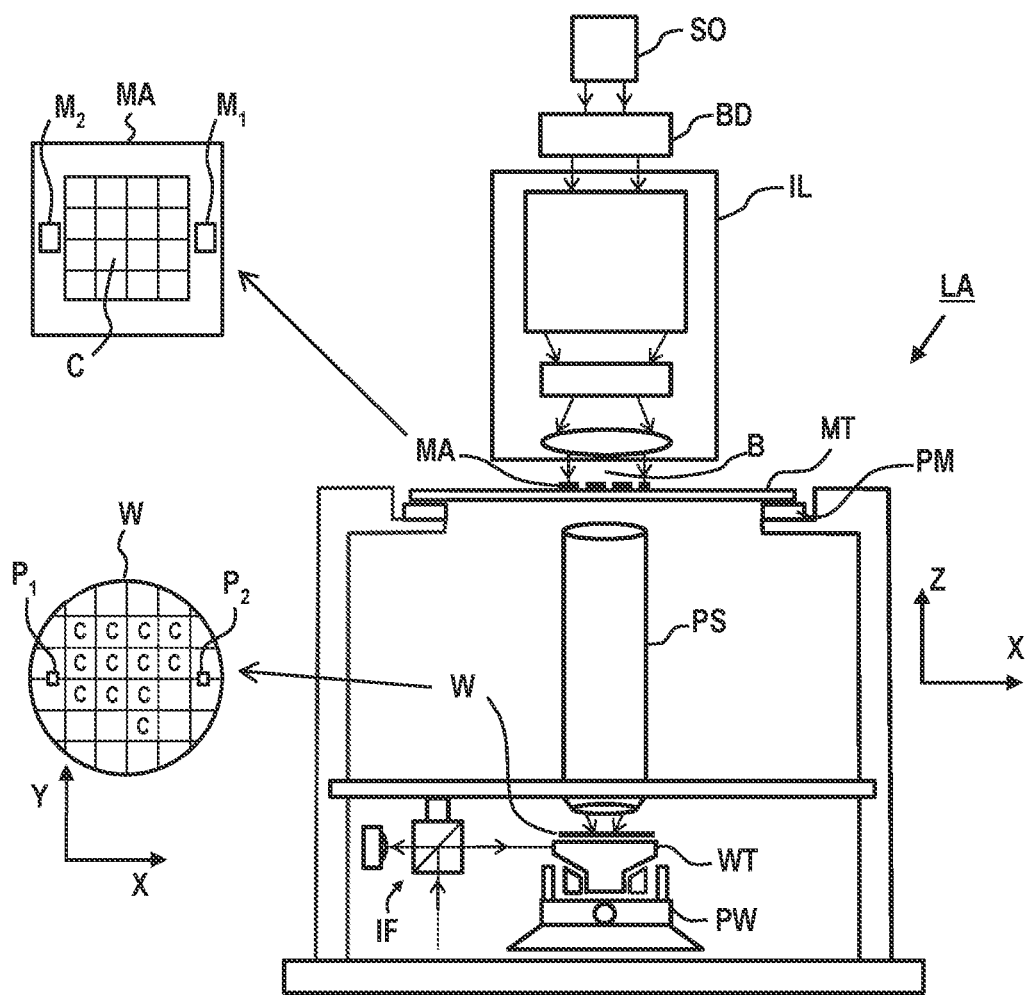
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illumination system IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
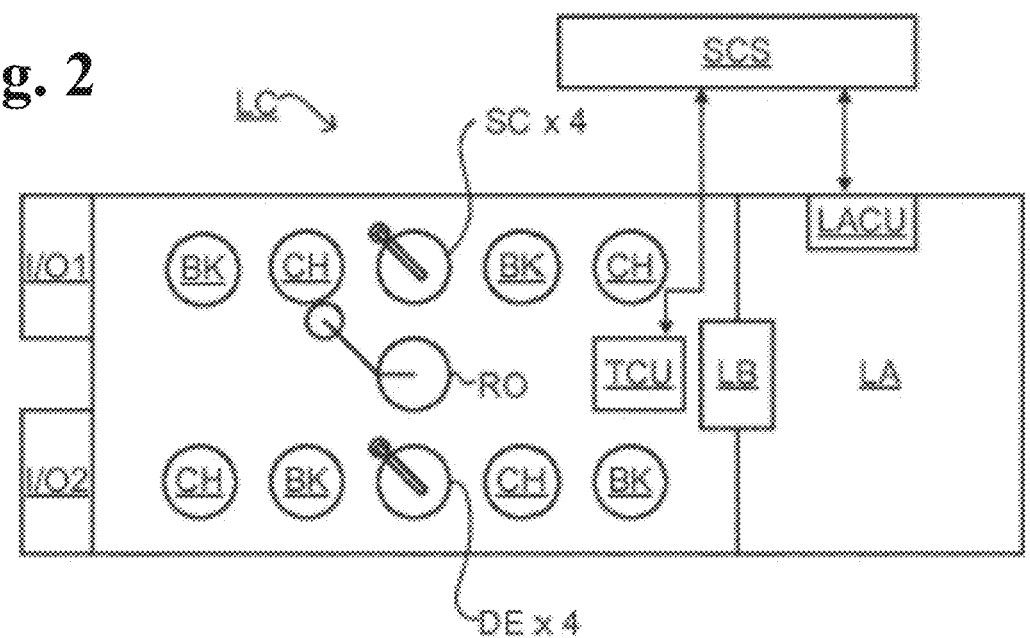
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
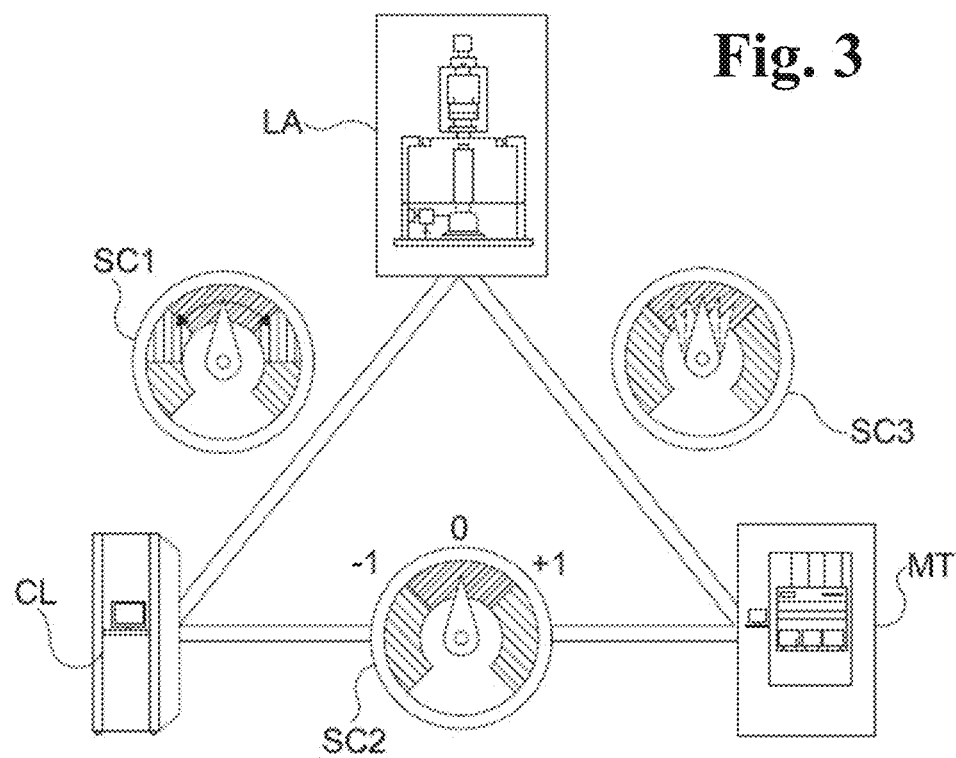
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

As an alternative to optical metrology methods, soft X-rays and/or EUV radiation may be used, for example radiation in a wavelength range between 0.1 nm and 100 nm, or optionally between 1 nm and 100 nm, or optionally between 1 nm and 50 nm, or optionally between 5 nm and 50 nm, or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The content of the cited US patent application are incorporated herein by reference in their entirety.

FIG. 4(*a*) presents an embodiment of a metrology apparatus and, more specifically, a dark field scatterometer. A target T and diffracted rays of measurement radiation used to illuminate the target are illustrated in more detail in FIG. 4(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 4(*b*), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line+1 and double dot-chain line−1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 4(a) and 4(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 4(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 4 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 4) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 4(c) and 4(d). The use of these, and numerous other variations and applications of the apparatus are described in prior published applications, mentioned above.

Figure 5:
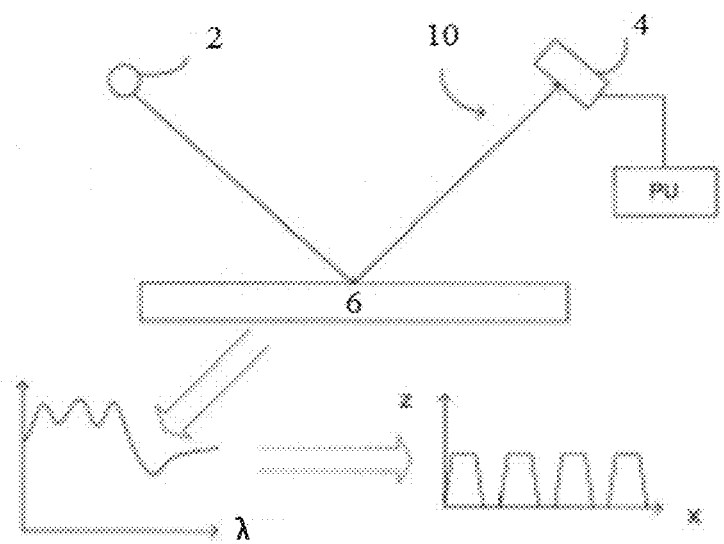
FIG. 5 depicts a schematic representation of a metrology apparatus.

A metrology apparatus, such as a scatterometer, is depicted in FIG. 5. It comprises a broadband (white light) radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 5. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 6:
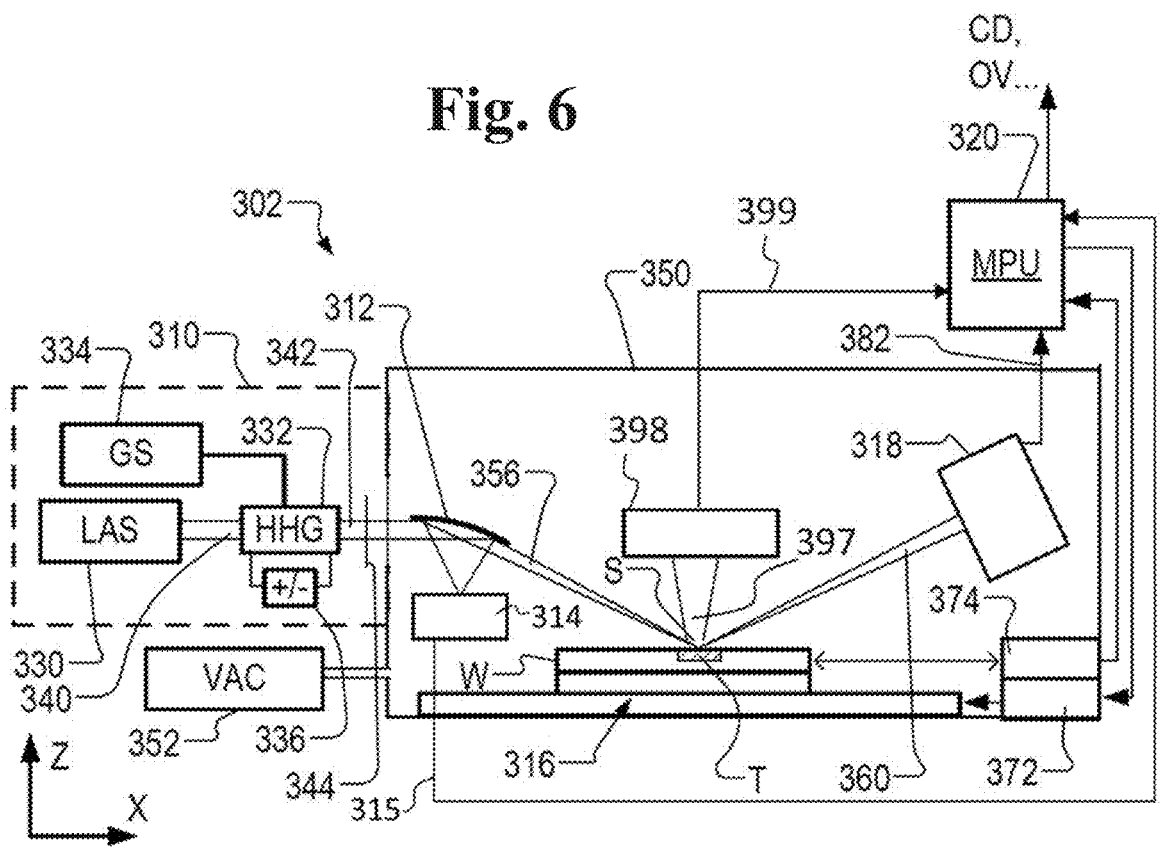
FIG. 6 depicts a schematic representation of a metrology apparatus.

FIG. 6 depicts a schematic representation of a metrology apparatus 302 in which radiation in the wavelength range from 0.1 nm to 100 nm may be used to measure parameters of structures on a substrate. The metrology apparatus 302 presented in FIG. 6 is suitable for the soft X-rays or EUV domain.

FIG. 6 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

In the context of this document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the 2nd to 5th harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminium (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labelled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 µm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 6, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 6 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generate a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

As described herein, a metrology system may use a radiation beam to characterise one or more properties of a system and/or the patterns created by that system. The system may be a lithographic system. The radiation may be used to illuminate a target substrate, the metrology tool MT may measure the resulting signals, and these signals may be analysed to determine one or more properties of the target substrate. The radiation beam may use optical radiation, Soft-X-Ray radiation, and/or EUV radiation, wherein the radiation may comprise one or more wavelengths in the 1 nm-2000 nm range. Disclosed herein are methods and apparatus for characterising the intensity profile of a radiation beam. Knowledge of the intensity profile of the radiation beam of the metrology apparatus may be used for example for qualification and alignment of optics of the system to be measured, for example illuminator IL optics of a lithographic system, or for model-based reconstruction of one or more parameters of the system. The intensity profile of a radiation beam can be determined at any point along the radiation path. Preferably, the intensity profile may be determined across a cross-section of the radiation beam representing an illumination spot of that radiation beam, that is to say, a cross-section of the beam used to irradiate the item to be measured or analysed, which may be referred to as a cross-section in an illumination plane. Alternatively, or additionally, the radiation beam intensity profile may be determined at a plane in the radiation path conjugate to the illumination plane.

In one method known in the art, a photodetector and knife-edge element are placed at the location to be illuminated by the radiation beam in the system. The knife-edge is a moveable object with a sharp edge, which can be moved across the photodetector to gradually block or unblock access to the photodetector. The signal measured by the photodetector illuminated by the radiation beam while the knife-edge element is moved across the photodetector can be used to determine the intensity profile of the illumination spot. The knife-edge method has a disadvantage that the photodetector and knife-edge element need to be placed into the system, which may require adaptation of the baseline setup of the system to be able to receive the photodetector and knife-edge element.

Disclosed herein are methods and apparatus for measuring an intensity profile across a radiation beam without requiring modification of the system. The metrology configuration 302 of FIG. 6 can be used for measuring an intensity profile across a radiation beam. The metrology apparatus 302 may be comprised within a metrology tool MT. The metrology configuration 302 comprises a radiation source 310, which may be a femtosecond infrared pulsed drive laser. Radiation source 310 may comprise a drive laser used for high harmonic generation (HHG), as set out above, to generate SXR and/or EUV radiation. Focusing optics, which may comprise for example a focusing mirror, may be used to direct the drive laser radiation to the area where HHG is generated. The focusing optics may be optimised for the wavelength of the drive laser. In other implementations, the radiation beam comprises a wavelength achievable without requiring HHG, for example a laser generating light of the desired wavelength. Illumination system 312 directs the radiation beam, which may be HHG generated, to a target structure of interest T. A target structure T is a structure that changes the scattering behaviour of the radiation, and may for example be a diffraction structure 712, see FIGS. 7(a)-(b), causing scattering of radiation into one or more diffraction orders. An intersection of the radiation beam with a target plane in which structure T is located, forms a cross-section of the beam across which an intensity profile of the radiation beam is to be determined, the cross-section of the radiation beam in the target plane may be referred to as radiation spot S. The target plane may be a plane of the system where the radiation beam is a focused radiation beam 356. Preferably, the target plane may be a plane of the system in which the radiation beam 356 of the metrology apparatus MT illuminates a target structure T to be measured. Metrology tool MT comprises radiation detectors 318, 398 for measuring signals reflected off target structure T. Although not shown in FIG. 6, the detectors may further comprise detectors for capturing transmitted radiation. In FIG. 6, detector 318 is a zeroth order radiation detector, combined with a spectrometer grating to detect a spectrally resolved signal. Detector 398 may comprise one or more detectors for diffraction orders other than the zeroth diffraction order. Although not shown in FIG. 6, detector 398 may also be combined with spectrometer gratings to achieve spectral resolution in the detected signal.

The structure T placed in the target plane for illumination by the radiation spot S, and used for determining the intensity profile across the radiation beam may be a diffraction structure 712. In order to obtain a measurement to determine an intensity profile of the beam, the diffraction structure 712 may be moved relative to the radiation beam 356. This may be achieved by moving the diffraction structure 712 and keeping the beam 356 stationary, moving the beam 356 and keeping the diffraction structure 712 stationary, or moving both the beam 356 and diffraction structure 712 simultaneously or consecutively. In order to move the diffraction structure 712, the structure may be placed on a substrate support 316, wherein the substrate support 316 may cause movement of the diffraction structure 712 relative to radiation beam 356. Substrate support 316 may comprise a substrate supporting table, for example a wafer table. The substrate supporting table may comprise an area for receiving a substrate, and the substrate supporting table may receive the diffraction structure 712 in an area of the substrate supporting table outside the area for receiving the substrate.

Figure 7A:
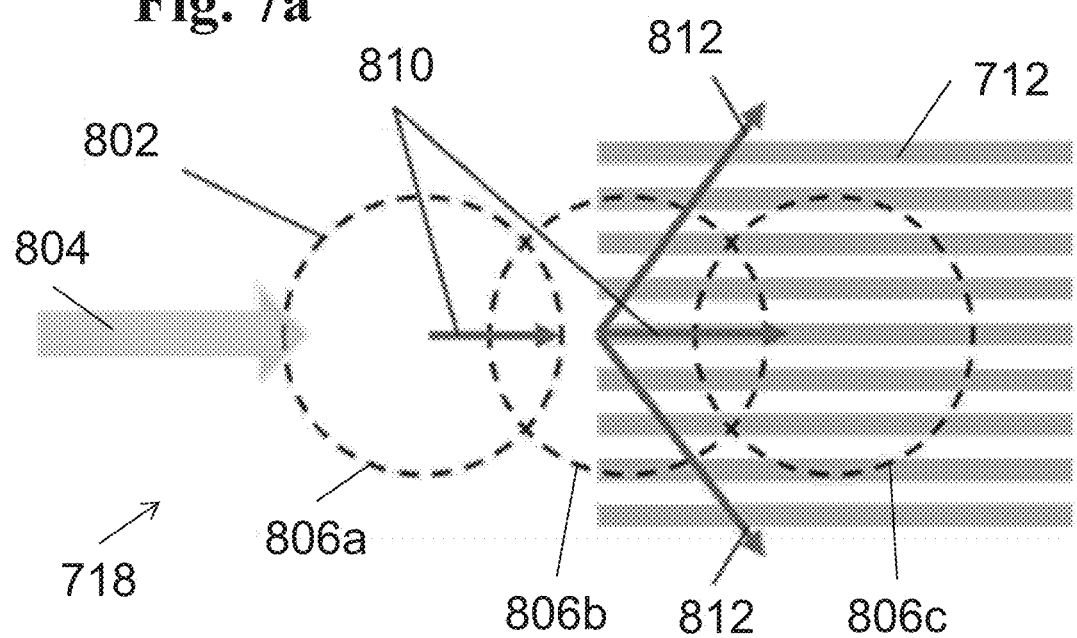
FIGS. 7a and 7b depict schematic representations of a cross-section of a radiation beam moving relative to a diffraction structure.

FIG. 7a depicts an example diffraction structure 712 to be moved relative to the radiation beam. Outline 802 represents a cross-section of the radiation beam in a target plane 718. The radiation beam is moved relative from a first position 806a to a second position 806c in a movement 804 which may be a scanning movement, along a scanning direction. Scanning direction 804 may be a linear scanning direction. Alternatively, the radiation beam may be moved relative to the diffraction structure 712 from a second position 806c to a first position 806a. In the first position 806a the radiation beam does not irradiate the diffraction structure 712. In the second position 806c, the radiation beam irradiates the diffraction structure 712. Preferably, in the second position 806c, the entire cross-section 802 of the radiation beam in the target plane falls onto the diffraction structure 712 and irradiates it. Along the movement 804 of the beam cross-section from the first position 806a to the second position 806c, the radiation beam may pass through several positions 806b wherein a portion of beam cross-section 802 falls outside the diffraction structure 712, and the rest of the beam cross-section 802 falls onto the diffraction structure 712.

Diffraction structure 712 may be formed on a substrate, which may be a reflective substrate. For example, the diffraction structure 712 may be a silicon structure, such as silicon lines, on a silicon wafer forming the reflective substrate. The diffraction structure may also be made of other suitable materials that are being used in a semiconductor process, such as, for example, a structure of thin lines made of metal. The reflective substrate may reflect a substantial amount of radiation incident on the surface through specular reflection, wherein the angle of incidence of the radiation beam is substantially equal to the angle of reflection of the radiation beam, as may be expressed for example using Snell's law. Using a diffractions structure 712 on a specular reflective substrate, substantially all of the reflected power of the radiation in location 806a may be reflected into zeroth diffraction order 810.

When the radiation beam is located in a first position 806a relative to the diffraction structure 712, so that the beam cross-section does not irradiate the diffraction structure 712, the reflected signal will comprise a specular reflection component, which may reflect into zeroth diffraction order 810. The surface outside the diffraction structure 712 may be chosen or designed to have a substantially different reflection and diffraction profile from the diffraction structure. Specifically, the surface irradiated outside the diffraction structure 712 may be chosen so that substantially no power is directed into the non-zero diffraction orders 812 of the diffraction structure 712. This may be achieved by having the surface to be irradiated outside the diffraction structure to be substantially flat and substantially smooth, for example so that power is directed into the specular reflection direction. As a result, when the radiation beam falls in a first position 806a, power may be reflected into the zeroth diffraction order 810, and substantially no power is directed into the directions of non-zero diffraction orders of the diffraction structure 712. In position 806c, some power may be directed into the zeroth diffraction order, and some power is diffracted by the diffraction structure 712 into non-zero diffraction orders 812. Non-zero diffraction orders 812 may be the +1 and −1 first diffraction orders. Some diffraction structures 712 may diffract radiation into multiple positive and negative diffraction orders, for example +2, +1, 0, −1, and −2 first and second diffraction orders.

During the movement 804 of radiation beam cross-section 802 relative to the diffraction structure, one or more radiation detectors 318, 398 may measure one or more diffracted signals. The radiation detectors 318, 398 may be power detectors and/or intensity detectors able to operate at the wavelength of the radiation beam 356. The intensity of radiation diffracted into a diffraction order, specifically, a non-zero diffraction order, may be used as a measure of the portion of the cross-section irradiating the diffraction structure 712. The one or more radiation detectors may be positioned to receive reflected and/or diffracted radiation. The positioning of the one or more radiation detectors relative to target plane 718 may be determined based on the wavelength, or wavelengths, of the radiation beam, the manner in which the radiation beam impinges on diffraction structure 712, such as for example the angle of incidence, the polarization of the radiation, and the diffraction pattern of the diffraction structure 712. The diffraction structure 712 may be a diffraction grating, which may be a substantially periodic diffraction grating, that is to say a periodic grating which may differ from the periodicity within design and fabrication tolerances of the methods and apparatus used to manufacture the grating. The periodic grating may be a periodic line grating, as illustrated in FIG. 7a. The diffraction angles of the periodic diffraction grating may be determined using a grating equation $d(\sin \theta_i - \sin \theta_m) = m\lambda$, wherein $\lambda$ is the wavelength of the radiation, d is the periodicity, or pitch, of the diffraction grating, $\theta_i$ is the angle of incidence of the radiation beam on the diffraction grating, m is the diffraction order, and $\theta_m$ is the angle of the diffraction radiation beam. The radiation detectors 318, 398 may be positioned in the beam propagation path of the diffraction angles. In the case of a periodic diffraction grating, detectors 398 may be located at the −1 and +1 first diffraction orders, which may be determined for example using the grating equation set out above. A single detector may have a large surface area so as to be able to detect a range of diffraction angles. Such a detector may be able to resolve the location on the detector at which intensity is received, and from that the diffraction angle. Alternatively, or additionally, an array of detectors may be used to cover a range of diffraction angles. Radiation detector 398 may for example be a pixel array, wherein different diffracted wavelengths may impinge on different pixels of the array of the detector. The radiation detector 398 may simultaneously measure a plurality of diffracted signals, wherein each signal corresponds to a different wavelength of the diffracted radiation. The signals measured by the detector may be used to determine intensity profiles for the different wavelengths, wherein the intensity profiles for the different wavelengths may be determined simultaneously. A pixel array may comprise pixels that measure intensity of the radiation that impinges on the pixels. A group of a plurality of pixels may be mapped onto a diffraction order corresponding to the location of that group of pixels. For example, a group of pixels may be mapped onto the +1 and −1 diffraction orders. Optionally, a group comprising pixels different to the group mapped onto the −1 and +1 diffraction orders, ma be mapped onto the −2 and +2 diffraction orders, another group of pixels on the −3 and +3 diffraction orders, etc. A detector 318 may be provided to measure radiation in the zeroth diffraction order 810.

During a movement 804 of the radiation beam relative to the diffraction structure 712 from a first position 806a to a second position 806c, the one or more radiation detectors 318, 398 detect radiation intensity, for example in +1 and/or −1 first diffraction orders of diffraction structure 712. Alternatively or additionally, the radiation detectors may detect radiation of one or more of the zeroth, second, third, . . . diffraction orders. As part of the movement from first position 806a to 806c, the detectors detect intensity of the radiation in the diffraction orders at one or more positions 806b, wherein a portion of the radiation beam cross-section 802 irradiates diffraction structure 712, and another portion does not irradiate the diffraction structure 712. Further measurements may be performed by detectors in the system to determine a position of the radiation beam relative to diffraction structure 712 corresponding to each intensity measurement. Specifically, the corresponding position may determine what portion of the radiation beam cross-section overlaps with the diffraction structure 712 for that intensity measurement. When moving a beam across a diffraction structure in a linear direction 804, the resulting intensity measurements provide a pattern that can be used to determine an intensity profile in a dimension along that linear direction.

A linear movement 804 between a first position and a second position may be used to determine an intensity profile in a first dimension. The cross-section may be scanned in other directions to the first direction In order to obtain an intensity profile in a second dimension other than the first dimension, the cross-section 802 of the radiation beam may be moved relative to the diffraction structure 712 from a third position to a fourth position. In the third position, the radiation beam does not irradiate the diffraction structure 712. In the fourth position, the radiation beam irradiates the diffraction structure 712. Preferably, in the fourth position, the entire cross-section 802 of the radiation beam in the target plane falls onto the diffraction structure 712 and irradiates it. The movement between third and fourth positions may be a linear movement, which may be in a direction lateral to the movement between first and second positions. Specifically, a linear movement between third and fourth positions may be perpendicular to a linear movement between first and second positions. Radiation detectors 318, 398 may be included in the apparatus in which the intensity of the radiation beam is determined, for detecting diffracted radiation off diffraction structure 712.

Figure 7B:
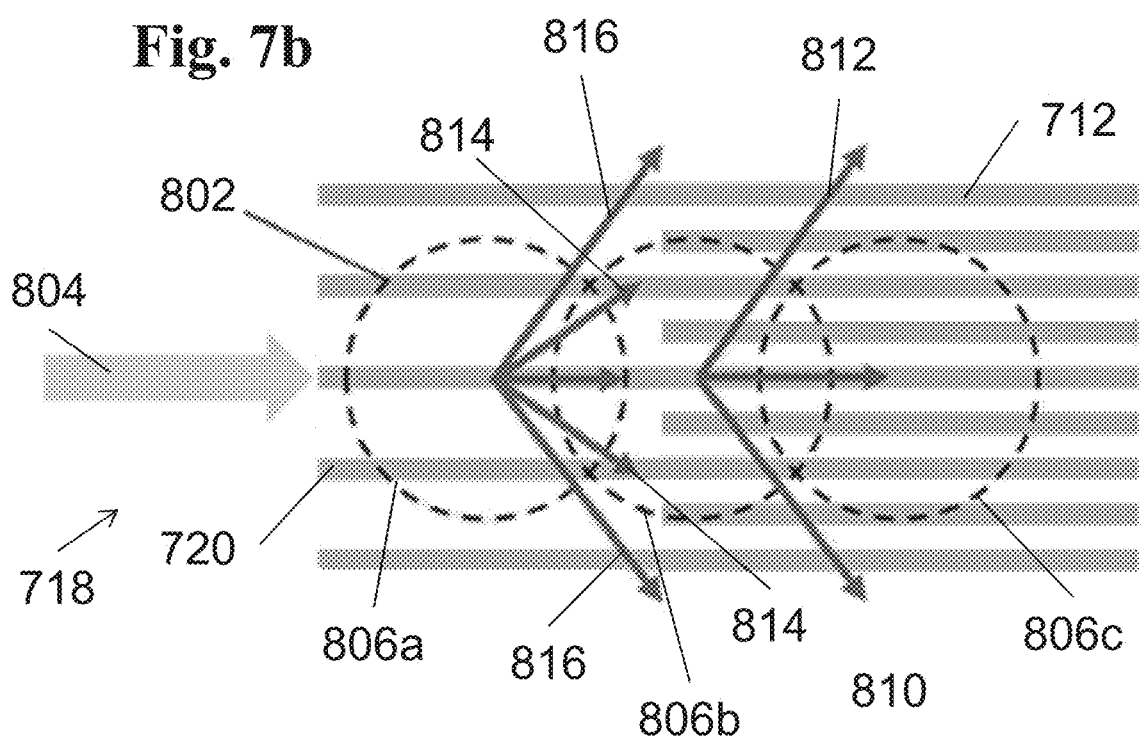

FIG. 7b depicts an example diffraction structure 712 for which the area neighbouring the diffraction structure comprises a reference diffraction structure 720, which may be a substantially periodic diffraction grating. The second diffraction structure may be referred to as a reference structure. Radiation measurements by detectors 318, 398 of radiation diffracted by reference structure 720 may be used as a reference for measurements in relation to diffraction structure 712. The reference diffraction structure 720 has different diffraction orders to the diffraction structure 712. For example, the reference diffraction structure may be periodic diffraction grating with first diffraction order 814, whereas diffraction structure 712 may be a periodic diffraction grating with +1, −1 first diffraction orders 812, at a different diffraction angle from diffraction order 814. Both diffraction structures 712, 720, may be diffraction gratings, and the lines of gratings 712, 720 may be substantially parallel to each other. The pitch of the reference diffraction grating 720 may be different from the pitch of the diffraction structure grating 712, so that the diffraction angles of non-zero diffraction orders are different for both structures 712 and 720. This way, radiation sensors may separate captured diffracted radiation from the diffraction structure 712 and reference diffraction structure 720 as they do not overlap. The pitch of the reference grating 720 may be larger than the pitch of the diffraction structure 712, so that for the wavelength of the radiation beam, the reference diffraction structure 720 further comprises +2, −2 second diffraction orders 816. In a first position 806a substantially the entire cross-section may irradiate reference diffraction structure 720. In a second position 806c substantially the entire cross-section may irradiate the diffraction structure 712. During the movement of the radiation beam relative to the diffraction structure 712, the radiation detectors 318, 398 measure intensity at one or more positions 806b wherein a portion of the beam is diffracted by diffraction structure 712, and another portion of the beam is diffracted by reference diffraction structure 720. As the beam moves from the first position to the second position, the intensity diffracted into first 814, and second 816, diffraction orders of the reference diffraction structure 720 decreases, while the intensity diffracted into diffraction order 812 of diffraction structure 712 increases. Further detectors may be included in the apparatus to measure diffraction from the reference diffraction structure 720. An advantage of using a reference diffraction structure is that measurements can be obtained by radiation detectors both for diffraction structure 712 and second diffraction structure 720. Intensity profiles can be calculated from the two sets of measurements separately, from diffraction structures 712 and 720 respectively. The above relating to a reference diffraction structure 720 applies as well for determination of an intensity profile in a second dimension, by relative movement between a third and fourth position.

The diffraction structure 712, which may be adjacent to a reference diffraction structure 720, may be formed by a lithographic process. The diffraction structure 712, and reference diffraction structure 720, may further be formed by an etching process. A lithographic process may be used to expose the pattern of a diffraction structure on a substrate 712. An etching process may be used to remove further material, wherein the exposed pattern may be used as a masking structure. Using lithography and etching based processes to form a diffraction structure may enable high precision and accuracy fabrication of the grating. A sharp pitch transition may be achieved due to the precise fabrication standards achievable with lithographic techniques. Such lithographic techniques may include fabrication using sub-resolution accuracy, for example using optical proximity correction (OPC), which may be used to improve printing of the diffraction structure 712. As a result of the high quality pitch transition and profile of the diffraction structure, the accuracy of the measured and determined cross-section intensity profile can be improved.

The diffraction structure 712 may have a preferred orientation in relation to the relative movement of the radiation beam. In the example where the diffraction structure is a periodic diffraction grating, the orientation of the diffraction structure 712 may be substantially parallel to the relative movement of the beam to the diffraction structure 712. FIG. 8 depicts a flow diagram 900 comprising steps in a method for determining an intensity profile of a radiation beam in a system. In step 902 the diffraction structure 712 is positioned into the system, wherein the shape and size of the diffraction structure 712 is such that the system does not need to be modified to receive the diffraction structure 712. As part of positioning of the diffraction structure 712, the angular orientation of the diffraction structure 712 is chosen relative to the radiation beam, and the direction in which the beam will be moved relative to the diffraction structure 712. The diffraction structure may be placed in a substrate plane of the system. In step 904 movement of the diffraction structure 712 relative to the radiation beam is caused between a first and second position. The diffraction structure 712 may be located on a substrate stage of the system, and movement of the substrate stage relative to the radiation beam may cause the movement of the diffraction structure relative to the beam. Alternatively, or additionally, the radiation beam may be moved. In step 906, intensity measurements are obtained during the movement of the structure 712 relative to the beam, by one or more radiation detectors 318, 398. The intensity measurements may be linked to position measurements of the cross-section 802 of the radiation beam relative to the structure 712. Based on the measurements by the sensors and corresponding position of the cross-section of the beam, a cumulative intensity signal M(x) is determined in step 908. This cumulative intensity signal M(x) represents the amount of diffracted radiation into a diffraction order for which the intensity measurements are obtained, and may therefore also be referred to as a cumulative diffraction function M(x). In step 910, this cumulative diffraction function is differentiated to determine the rate of change in cumulative intensity for positions between the first and second positions. The rate of change represents the amount of intensity contributed by the part of the cross-section newly irradiating the diffraction structure 712. This calculated derivative, represents a determined intensity profile dM(x)/dx, as set out in step 912. This is set out in FIG. 9, wherein signal S(x) represents a known intensity profile of a cross-section of a radiation beam in a direction x. Signal M(x) represents a measured cumulative intensity signal measured by one or more detectors in a diffraction order, as the cross-section is move onto diffraction structure 712 along the x-direction. Signal dM(x)/dx represents the derivative of the measured signal M(x) and represents a determined intensity profile of the cross-section of the beam in the x-direction.

Figure 9:
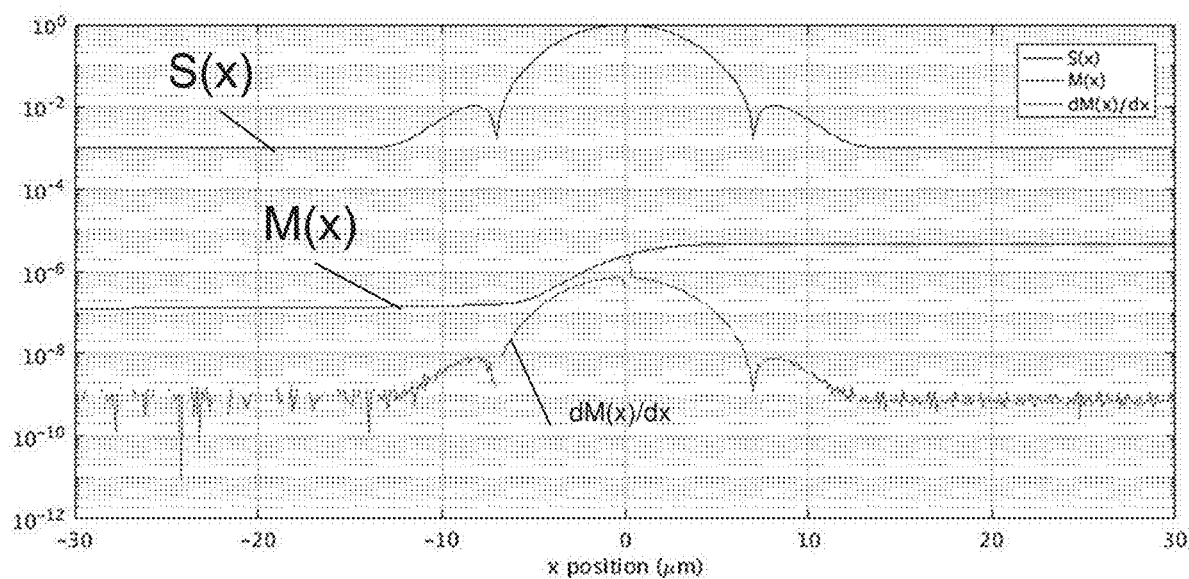
FIG. 9 depicts a graph of known and determined intensity profiles and cumulative intensity measurements.

The resulting signal dM(x)/dx provides an intensity profile in one dimension, noted in FIG. 9 as the x-direction, a first direction. If more directions are required 914 to determine an overall intensity profile in more dimensions, step 916 signifies a return to the start of the method and repeating steps 902 to 912. Positioning of the diffraction structure 712 in step 902 is done in relation to a movement in step 904 in a second direction, not parallel to the first direction. Specifically, the second direction may be perpendicular to the first direction. The method may be repeated for 2 directions to obtain a two-dimensional intensity profile, or may be repeated more than 2 times, for example up to 10 times, to obtain a larger set of measurements from which to construct an intensity profile, for example to average out intensity measurements. If, at the end of step 912, no more directions are needed 918, the one or more intensity profiles obtained using the method above, are assembled in step 920 to determine an overall intensity profile.

The following paragraphs will describe in detail a determination procedure of an intensity profile of a cross-section of a radiation beam in a target plane. A cross-section of a radiation beam is scanned over a target diffraction structure, wherein the diffraction structure is planar, and can be positioned inside the system of the radiation beam without requiring adaptation. Specifically, the diffractions structure 712 may be a planar line diffraction grating. The pitch of the grating is set relative to the wavelength of the radiation so that when the cross-section is scanned over the grating, first order diffracted radiation will be detected by radiation detectors located in the system. As the cross-section is scanned over the grating, the cross-section scans over the grating edge profile. Grating edge profiles may be produced to be steep, for example reaching 100 nm in height, perpendicular to the substrate surface, and 10 nm in length, parallel to the substrate surface. This steep profile may be achieved for example by using lithographic fabrication procedure to form the grating.

Figure 10:
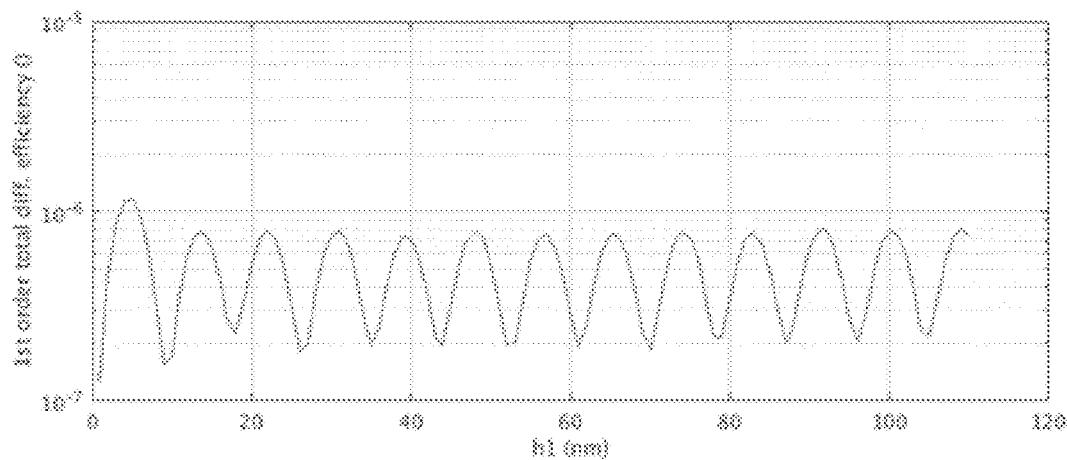
FIG. 10 depicts a graph showing diffraction efficiency variation as a function of diffraction grating height.

The diffraction efficiency may be affected by the dimensions of the grating edge profile. FIG. 10 depicts a graph estimating the diffraction efficiency into the first diffraction order as a function of grating height h1 in nm, for a silicon grating with a 90 nm pitch, and using an infinitely narrow radiation beam with a wavelength of 15 nm, passing over the grating edge. Example dimensions of a cross-section passing over a grating edge are of the order of µm, for example 10 µm. Taking an example steep grating edge length of around 10 nm, a cross-section size of approximately 10 µm only has 1/1000 of its diameter incident on the grating edge. As a result, the contribution of this fluctuation in diffraction efficiency to the total measured signal may be small. Gratings with a smaller height h1 may exhibit a smaller effect of the grating edge profile on the measured signal, as there are fewer expected oscillations of the diffraction orders.

For a general two-dimensional cross-section profile S(x, y), the measured signal in the diffraction orders can be formulated as:

$$M(x) = \int_{-\infty}^{+\infty} \int_{-\infty}^{+\infty} S(x', y') p(x - x') dx' dy'$$

wherein p represents the response of a pencil beam, or a fan beam, that is scanned over the grating edge profile. The function p may be similar to the efficiency plot shown in FIG. 10, as it is caused by the height profile of the grating edge, for example over a 10 nm wide region. Compared to a beam diameter of 10 µm, the 10 nm effect of p, resulting from the grating edge, may be approximated by a step function u. The error introduced by this approximation may be small, and negligible for a steep grating edge profile of e.g. 10 nm.

Approximating p by step function u, the expression for the measured signal M(x) becomes:

$$M(x) = \int_{-\infty}^{+\infty} \int_{-\infty}^{+\infty} S(x', y') u(x - x') dx' dy'$$

Assuming the cross-section profile function S to be separable into 2 dimensions, x and y: $S(x, y) = S_x(x) S_y(y)$, the cross-section along the x-direction, as illustrated in FIG. 9, can be approximated by differentiation of the measurement signal M(x):

$$\frac{dM(x)}{dx} = \int_{-\infty}^{+\infty} S_y(y') dy' \int_{-\infty}^{+\infty} S_x(x') \frac{d}{dx} u(x - x') dx'$$

$$\frac{dM(x)}{dx} = \int_{-\infty}^{+\infty} S_y(y')dy' \int_{-\infty}^{+\infty} S_x(x')\delta(x-x')dx'$$

wherein δ represents a Dirac delta-function of an ideal point function. From this the above equation can be solved for $S_x(x)$ as:

$$S_x(x) = \frac{dM(x)}{dx} \bigg/ \int_{-\infty}^{+\infty} S_y(y')dy'$$

wherein the integral in y' has a numerical value when solved. The same method as set out above can be used for solving the equation to obtain $S_y(y)$. The determined intensity profile $$\frac{dM(x)}{dx}$$

using the method described herein is illustrated in FIG. 9. From the close approximation between $$\frac{dM(x)}{dx}$$

and S(x) in FIG. 9, it can be seen that the approximation of function p of the steep grating edge with a step function, does not introduce a substantial error.

Although specific reference is made in this text to movement of a radiation beam relative to a diffraction structure from a first position to a second position, and from a third position to a fourth position, the skilled person would understand that the order assigned to these positions is arbitrary, and that the methods and apparatus described above would also work for relative movement from a second position to a first position, and/or from a fourth position to a third position.

Further embodiments are disclosed in the subsequent numbered clauses:

1. A method of determining an intensity profile of a radiation beam, the method comprising:
   providing a diffraction structure;
   causing relative movement of the diffraction structure relative to the radiation beam from a first position, wherein the radiation beam does not irradiate the diffraction structure to a second position wherein the radiation beam irradiates the diffraction structure;
   measuring, with a radiation detector, diffracted radiation signals produced from diffraction of the radiation beam by the diffraction structure as the diffraction structure transitions from the first position to the second position or vice versa; and
   determining the intensity profile of the radiation beam based on the measured diffracted radiation signals.

2. The method of clause 1 wherein in the second position substantially the entire cross-section of the radiation beam irradiates the diffraction surface.

3. A method according to clause 1 wherein the intensity profile is determined for a dimension of a cross-section of the radiation beam in a plane lateral to the propagation direction of the radiation beam.

4. A method according to clause 3 wherein the intensity profile of the radiation beam is determined in a target plane.

5. A method according to clause wherein the target plane is located in a focal plane of the radiation beam.

6. A method according to any of clauses 4 or 5 wherein the target plane is located in a substrate plane.

7. A method according to any of the preceding clauses wherein the causing relative movement comprises moving the diffraction structure linearly in a first direction.

8. A method according to clause 1 wherein the method further comprises:
   moving the diffraction structure linearly in a second direction from a third position wherein the radiation beam does not irradiate the diffraction structure to a fourth position wherein of the radiation beam irradiates the diffraction structure, or vice versa.

9. A method according to any of the preceding clauses wherein the diffraction structure is a diffraction grating structure.

10. A method according to clause 9 wherein the diffraction grating structure has a structure formed by a lithographic process.

11. A method according to clause 10 wherein the diffraction grating structure has a structure formed by an etching process.

12. A method according to any of clauses 9 to 11 wherein the diffraction grating structure has a pitch, wherein the pitch is selected to obtain at least one diffraction order when irradiated by the radiation beam.

13. A method according to clause 1 wherein the diffracted radiation signals are first order diffracted signals.

14. A method according to any of clauses 9 to 13, wherein, in the first position, the radiation beam irradiates a reference structure, wherein the reference structure comprises a reference diffraction grating with a different pitch to the diffraction grating, and wherein the move from the first position to the second position includes a transition of the radiation beam from the reference structure to the diffraction grating.

15. A method according to clause 1 wherein determining the intensity profile comprises:
   determining a cumulative diffraction function, based on the measured data, of the diffracted radiation as a function of location of the diffraction grating relative to the radiation beam; and
   differentiating the cumulative diffraction function to obtain the intensity profile.

16. A method according to any of the preceding clauses wherein the radiation beam is a soft X-ray radiation beam or an Extreme Ultra Violet (EUV) radiation beam.

17. A method according to any of the preceding clauses wherein the radiation beam comprises a plurality of wavelengths, and wherein the method further comprises:
   simultaneously measuring, with a radiation detector, a plurality of diffracted radiation signals for the plurality of wavelengths; and
   determining the intensity profile of the radiation beam for the plurality of wavelengths.

18. A method according to clause 17 wherein the intensity profile of the radiation beam is determined for the plurality of wavelengths simultaneously.

19. An apparatus for determining an intensity profile of a radiation beam, the apparatus comprising:
   a diffraction structure moveable relative to the radiation beam from a first position in which the diffraction structure is not irradiated by the radiation beam to a second position in which the diffraction structure is irradiated by the radiation beam, or vice versa;

a radiation detector configured to detect diffracted radiation signals of the radiation beam diffracted by the diffraction structure; and a processor configured to execute instructions comprising:

receiving data representing the diffracted radiation signals from the radiation detector; and determining the intensity profile, based on the received data representing the diffracted radiation signals.

20. An apparatus according to clause 19 wherein the diffraction structure is located on a substrate support of the apparatus.

21. An apparatus according to clause 20 wherein the processor is further configured to execute instructions to control movement of the substrate support to cause movement of the structure linearly from the first position to the second position, or vice versa.

22. An apparatus according to clause 21 wherein the processor is further configured to execute instructions to control movement of the substrate support to cause movement of the structure linearly from a third position wherein the radiation beam does not irradiate the diffraction structure to a fourth position wherein the radiation beam irradiates the diffraction structure.

23. An apparatus according to any of clauses 19 to 22 wherein the diffraction structure is a diffraction grating.

24. An apparatus according to any of clauses 19 to 23, further comprising a reference structure moveable with the diffraction structure, wherein the radiation beam irradiates the reference structure at the first position.

25. An apparatus according to clause 24 wherein the reference structure comprises a reference diffraction grating with a different pitch to that of the diffraction structure.

26. An apparatus according to any of clauses 19 to 25 further comprising a substrate supporting table, wherein the diffraction structure is provided on an area of the substrate supporting table outside an area for receiving a substrate.

27. A metrology apparatus comprising the apparatus according to one of the clauses 19-26.

28. A lithographic cell comprising the apparatus according to one of the clauses 19-26 or comprising the metrology apparatus according to clause 27.

29. A carrier containing a computer program wherein the carrier is a non-transitory computer readable storage medium, and wherein the computer program comprises instructions for being executed on at least one processor of an apparatus, which when executed cause the processor to carry out a method according to any of clauses 1-17.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The methods described herein may be in the form of instructions comprised on an electronic data carrier. An electronic data carrier may comprise hardware, or downloadable and transmittable signals over a wired or wireless connectivity medium.

One or more steps of the above invention may be implemented by a processor configured to execute instructions stored in an electronic data carrier, such as a memory, wherein the processor may be comprised in the apparatus executing the instructions, or on separate hardware connected to the apparatus, and able to provide instructions to the apparatus. The processor may comprise one or more of a microprocessor, a single core processor, or a multi-core processor, for example a dual core or a quad core processor. The processor may comprise a plurality of processors.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining an intensity profile of a radiation beam, the method comprising:

causing a relative movement of a diffraction structure relative to the radiation beam from a first position, wherein the radiation beam does not irradiate the diffraction structure to a second position, and wherein the radiation beam irradiates the diffraction structure;

measuring, with a radiation detector, diffracted radiation signals produced from the diffraction of the radiation beam by the diffraction structure as the diffraction structure transitions from the first position to the second position or from the second position to the first position; and determining the intensity profile of the radiation beam based on the measured diffracted radiation signals.

2. The method of claim 1, wherein a diffraction surface of the diffraction structure in the second position comprises substantially an entire cross-section of the radiation beam irradiating the diffraction structure.

3. The method of claim 1, wherein determining the intensity profile of the radiation beam based on the measured diffracted radiation signals comprises determining the intensity profile for a dimension of a cross-section of the radiation beam in a plane lateral to a propagation direction of the radiation beam.

4. The method of claim 3, wherein the determining comprises determining the intensity profile of the radiation beam at a target plane that is located in a substrate plane.

5. The method of claim 1, wherein the determining comprises determining the intensity profile of the radiation beam at a target plane that is located in a focal plane of the radiation beam.

6. The method of claim 1, wherein the causing relative movement of the diffraction structure relative to the radiation beam from the first position to the second position comprises moving the diffraction structure linearly in a first direction.

7. The method of claim 1, wherein the method further comprises:
moving the diffraction structure linearly in a second direction from a third position, wherein the radiation beam does not irradiate the diffraction structure, to a fourth position, wherein the radiation beam irradiates the diffraction structure, or from the fourth position, wherein the radiation beam does not irradiate the diffraction structure, to the third position, wherein the radiation beam irradiates the diffraction structure.

8. The method of claim 1, wherein the diffraction structure comprises a diffraction grating structure.

9. The method of claim 1, wherein the diffracted radiation signals comprise first-order diffracted radiation signals.

10. The method of claim 1, wherein causing the relative movement of the diffraction structure relative to the radiation beam comprises moving the radiation beam while not moving the diffraction structure.

11. The method of claim 1, wherein determining the intensity profile of the radiation beam based on the measured diffracted radiation signals comprises:
determining a cumulative diffraction function, based on measured data, of the diffracted radiation signals as a function of a location of the diffraction structure relative to the radiation beam; and
differentiating the cumulative diffraction function with respect to the relevant movement to obtain the intensity profile.

12. The method of claim 1, wherein the radiation beam comprises a plurality of wavelengths, and wherein the method further comprises:
simultaneously measuring, with the radiation detector, a plurality of diffracted radiation signals for the plurality of wavelengths; and
determining the intensity profile of the radiation beam for the plurality of wavelengths.

13. The method of claim 1, wherein determining the intensity profile of the radiation beam based on the measured diffracted radiation signals comprises determining the intensity profile for a dimension of a cross-section of the radiation beam in a target plane lateral to a propagation direction of the radiation beam.

14. The method of claim 1, wherein the radiation beam comprises a plurality of wavelengths, and wherein the method further comprises:
simultaneously measuring, with the radiation detector, a plurality of diffracted radiation signals for the plurality of wavelengths; and
simultaneously determining the intensity profile of the radiation beam for the plurality of wavelengths.

15. A non-transitory computer-readable storage device having instructions stored thereon, an execution of which, by a computing device, cause the computing device to perform operations of claim 1.

16. An apparatus for determining an intensity profile of a radiation beam, the apparatus comprising:
a diffraction structure moveable relative to a radiation beam from a first position, in which the diffraction structure is not irradiated by the radiation beam, to a second position, in which the diffraction structure is irradiated by the radiation beam, or from the second position to the first position;
a radiation detector configured to detect diffracted radiation signals of the radiation beam diffracted by the diffraction structure; and
a processor configured to execute instructions comprising:
receiving data representing the diffracted radiation signals from the radiation detector; and
determining an intensity profile, based on the received data representing the diffracted radiation signals.

17. A lithographic cell comprising:
a radiation source configured to output a radiation beam;
an apparatus that determines an intensity profile of the radiation beam, wherein the apparatus comprises:
a diffraction structure moveable relative to the radiation beam from a first position, in which the diffraction structure is not irradiated by the radiation beam, to a second position, in which the diffraction structure is irradiated by the radiation beam, or from the second position to the first position;
a radiation detector configured to detect diffracted radiation signals of the radiation beam diffracted by the diffraction structure; and
a processor configured to execute instructions comprising:
receiving data representing the diffracted radiation signals from the radiation detector; and
determining an intensity profile, based on the received data representing the diffracted radiation signals.

* * * * *